United States Patent
Hsu et al.

(10) Patent No.: US 8,661,635 B2
(45) Date of Patent: Mar. 4, 2014

(54) METHOD OF MANUFACTURING A PIEZOELECTRONIC DEVICE

(75) Inventors: Wen-Kuang Hsu, Hsinchu (TW); Hsin-Fu Kuo, Hsinchu (TW); Yu-Hsien Lin, Hsinchu (TW); Chiung-Wen Tang, Hsinchu (TW); Chieh-Lien Lu, Hsinchu (TW); Yao-Cheng Lai, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 189 days.

(21) Appl. No.: 13/106,322

(22) Filed: May 12, 2011

(65) Prior Publication Data

US 2011/0214264 A1 Sep. 8, 2011

Related U.S. Application Data

(62) Division of application No. 12/662,021, filed on Mar. 29, 2010, now Pat. No. 7,999,446.

(30) Foreign Application Priority Data

Feb. 4, 2010 (TW) .............................. 99103302 A

(51) Int. Cl.
  *H01L 41/24* (2011.01)
(52) U.S. Cl.
  USPC ............ 29/25.35; 29/846; 977/844; 977/858; 977/882
(58) Field of Classification Search
  USPC ......... 29/25.35, 594, 846, 831; 977/844, 847, 977/858, 882; 310/339; 445/50, 51
  See application file for complete search history.

(56) References Cited

U.S. PATENT DOCUMENTS

| 7,357,691 | B2* | 4/2008 | Liu et al. ..................... 445/51 X |
| 7,777,478 | B2 | 8/2010 | Dai et al. |
| 2004/0192152 | A1* | 9/2004 | Liu et al. ......................... 445/51 |
| 2007/0210678 | A1 | 9/2007 | Hattori et al. |
| 2007/0237705 | A1 | 10/2007 | Itoh et al. |
| 2008/0129278 | A1 | 6/2008 | Dai et al. |
| 2009/0309456 | A1 | 12/2009 | Stollberg |
| 2010/0060109 | A1* | 3/2010 | Russell et al. ........... 29/25.35 X |
| 2010/0141095 | A1 | 6/2010 | Park |
| 2010/0296677 | A1 | 11/2010 | Jiang et al. |

FOREIGN PATENT DOCUMENTS

JP 2005318040 A * 11/2005

OTHER PUBLICATIONS

Y.M. Ho, et al. "Spectroscopic investigation on carbon nanotubes coated with ZnO nanoparticles," Journal of Physics D: Applied Physics, 41 (2008) 065308. pp. 1-6.
Ya Yan, et al, "Photocatalytic Activity of Nanocomposites of ZnO and Multi-Walled Carbon Nanotubes for Dye Degradiation," Journal of Dispersion Science and Technology, 30: 198 203. (2009) pp. 198-203.

(Continued)

*Primary Examiner* — A. Dexter Tugbang
(74) *Attorney, Agent, or Firm* — Bacon & Thomas, PLLC

(57) ABSTRACT

A piezoelectronic device and a method of fabricating the same are provided. The piezoelectronic device has a plurality of carbon nanotubes; at least one piezoceramic layer covering the plurality of carbon nanotubes; and a supporting material for supporting the carbon nanotubes and disposed between the carbon nanotubes, the supporting layer being coated with at least one piezoceramic layer, wherein the plurality of carbon nanotubes is arranged in a comb-shape.

7 Claims, 9 Drawing Sheets

(56) References Cited

OTHER PUBLICATIONS

Linqin Jiang, et al. "Fabrication and characterization of ZnO-coated multi-walled carbon nanotubes with enhanced photocatalytic activity," Materials Chemistry and Physics 91 (2005) pp. 313-316.

Yanwu Zhu, et al. "Multiwalled Carbon Nanotubes Beaded with ZnO Nanoparticles for Ultrafast Nonlinear Optical Switching," Advanced Materials (2006) 18, pp. 587-592.

* cited by examiner

METHOD OF MANUFACTURING A PIEZOELECTRONIC DEVICE

This application is a divisional application of U.S. patent application Ser. No. 12/662,021, filed Mar. 29, 2010, which was patented on Aug. 16, 2011 as U.S. Pat. No. 7,999,446 (of which the entire disclosure of the prior application is hereby incorporated by reference).

BACKGROUND OF THE INVENTION

1. Field of the Invention

The present invention relates to a piezoelectronic device and a method of fabricating the same and, more particularly, to a piezoelectronic device having carbon nanotubes covered with a piezoelectronic material and the method of fabricating the same.

2. Description of Related Art

Piezoelectronic effect is the ability of some materials to convert mechanical stress into electrical energy by generating an electric field or electric potential in response to applied mechanical stress. Piezoelectronic materials can be applied into numerous uses such as bio-medical usages, electrical vehicle, wind power plants, hydroelectric power plant, wireless sensors, personal electronics, micro-electro-mechanical systems (MEMS), nano-electro-mechanical systems (NEMS) etc. Materials exhibit piezoelectricity, including ceramics such as $BaTiO_3$ (BT, barium titanate) or $Pb(Zr_{0.53}Ti_{0.47})O_3$ (PZT, lead zirconate-titanate), single crystals such as quartz, tourmaline, Rochelle salts, tantalates, niobates, aluminium nitride (AlN), gallium nitride (GaN), or zinc oxide (ZnO), etc. In order to output large amount of electricity, nano-sized piezoelectronic devices provides high specific surface area, therefore zinc oxide nanowires are produced to serve as the nano-scaled piezoelectronic material of the new generation piezoelectronic devices.

In this regard, a piezoelectronic material made of zinc oxide nanowires is proposed in US2008/0067618 for the manufacture of piezoelectronic devices. Reference with FIG. 1, a piezoelectronic device of prior arts comprises: a first conductive layer 11 (serves as a lower electrode) and a second conductive layer 12 (serves as an upper electrode); a plurality of zinc oxide nanotubes 13 locating between the first conductive layer 11 and the second conductive layer 12, in which one end of each of the zinc oxide nanotubes 13 connects with the first conductive layer 11. Therefore, when a mechanical strength is applied to the second conductive layer 12 to compress the zinc oxide nanotubes 13, an induced voltage or current is generated as well as a piezoelectronic effect due to the compression.

However, the induced current obtained from a conventional piezoelectronic device is only about $10^{-12}$ to $10^{-9}$ μA. And since the zinc oxide nanotubes are easily broken due to low elasticity thereof, the piezoelectronic device using the zinc oxide nanotubes may have low reliability and short lifespan. Therefore, it is desirable to provide an improved piezoelectronic device to obviate the aforementioned problems such as easy fracture and short lifespan, and to improve the reliability of the piezoelectronic device.

SUMMARY OF THE INVENTION

The present invention provides a piezoelectronic device, which comprises: a plurality of carbon nanotubes; at least one piezoceramic layer covering the plurality of carbon nanotubes; and a supporting material for supporting the carbon nanotubes that are covered with the at least one piezoceramic layer, wherein the supporting material is disposed between the carbon nanotubes, the plurality of carbon nanotubes is arranged in a comb-shape; some of the carbon nanotubes electrically connect with each other through the at least one piezoceramic layer; and the carbon nanotubes, the at least one piezoceramic layer, and the supporting material together form a piezoelectronic block.

The piezoelectronic device of the present invention comprises carbon nanotubes covered with zinc oxide layers and therefore has advantages of being, flexible and reliable, further having excellent piezoelectronic efficiency since the carbon nanotubes possess good flexibility and the zinc oxide layers have satisfactory piezoelectronic characteristic. The induced current obtained from the piezoelectronic device of the present invention is about 1.5 μA or above as well as induced voltage being over 1V when the size of the piezoelectronic block is 2.5 mm×1 mm×1 mm (length×width×height) compared with an induced current of $10^{-12}$ to $10^{-9}$ Å of a conventional piezoelectronic device. The induced voltage and current of the piezoelectronic device of the present invention can be regulated depending on the volume of the piezoelectronic device, i.e. the voltage can be increased to 1V or above and the current to 1 mA or above by connecting several piezoelectronic devices in parallel or in series, or by increasing the size of single piezoelectronic device.

According to the piezoelectronic device of the present invention, preferably, the piezoceramic layers coating on different carbon nanotubes electrically connect with each other.

Preferably, the piezoelectronic device of the present invention may further comprise a first conductive layer and a second conductive layer arranged respectively at two opposite sides (e.g. an upper side and a lower side or a left side and a right side) of the piezoelectronic block, wherein the first conductive layer and the second conductive layer electrically connect with the at least one piezoceramic layer of the piezoelectronic block respectively. Preferably, the first conductive layer and the second conductive layer are independently made of metal such as gold, silver, copper, platinum, titanium, palladium, or the alloy thereof, but each is not limited thereto.

The piezoelectronic device of the present invention may be connected in parallel or in series. When a first conductive layer and a second conductive layer are arranged at the upper and the lower sides of the piezoelectronic block respectively (i.e. the axial direction of the carbon nanotubes is practically perpendicular to the surface of the conductive layers), the piezoelectronic device is connected in parallel, and the current can be increased to over 1 μA when the size (i.e. the parallel connecting length) of the piezoelectronic device is more than 1 mm. Alternatively, when a first conductive layer and a second conductive layer are arranged at two opposite side surfaces of the piezoelectronic block respectively (i.e. the axial direction of the carbon nanotubes is parallel to the surface of the conductive layers), the piezoelectronic device is connected in series, and the voltage can be increased to over 1V while the size (i.e. the series connecting length) of the piezoelectronic device is more than 2.5 mm.

Because the intrinsic schottky barrier is created between carbon nanotube and piezoceramic materials contributed to rectify the output current, redundant schottky contacts created between carbon nanotubes or piezoceramic materials with conductive layers will lower the output performance. Therefore the choice of the used metal material for the conductive layer is important. For example, when a ZnO and carbon nanotube-composed piezoelectronic device connect in parallel with silver and copper as the materials of the first and second conducting layers respectively, the piezoelectronic device performs not as good as that applied with both silver conducting layers does due to the spare schottky contact between carbon nanotube and copper. Because the work function, the Fermi level, and the electron affinity of every piezoelectronic material are different, the determine of metal contact is alternative for maximum current output efficiency.

According to the piezoelectronic device of the present invention, the supporting material is disposed between the carbon nanotubes in order to support the carbon nanotubes, in which the supporting material may be made of polymer such as one selected from a group consisted of: parylene, polyurethane, polyethylene, polyvinylchloride, polydimethylsiloxane, pyromellitic dianhydride, polyimide, polyvinyl alcohol, and a mixture thereof. The carbon nanotubes may be joined with the supporting material and together form a flexible thin film having piezoelectrical properties (i.e. the piezoelectronic device of the present invention).

According to the piezoelectronic device of the present invention, the piezoceramic layer covering on the carbon nanotubes may preferably have a thickness of 0.5 Å to 2000 Å.

According to the piezoelectronic device of the present invention, the piezoceramic layer, which covers the carbon nanotubes, may be made of zinc oxide, aluminium nitride (AlN), gallium nitride (GaN), quartz, tourmaline, Rochelle salts, tantalates, niobates, or barium titanate, and may be preferably made of zinc oxide or aluminum nitride.

The present invention further provide a method of fabricating a piezoelectronic device, which comprises steps: (a) providing a substrate; (b) forming a plurality of carbon nanotubes on the substrate; (c) forming at least one piezoceramic layer covering the plurality of carbon nanotubes, wherein some of the carbon nanotubes electrically connect with each other through the at least one piezoceramic layer; (d) filling a space between the carbon nanotubes, which is covered with the at least one piezoceramic layer, with a filling material; and (e) removing the substrate to provide a piezoelectronic block comprising the carbon nanotubes, the at least one piezoceramic layer, and the supporting material.

The piezoelectronic device made by the method of the present invention comprises carbon nanotubes covered with zinc oxide layers and therefore has advantages of being flexible and reliable, further having excellent piezoelectronic efficiency since the carbon nanotubes possess good flexibility and the zinc oxide layers have satisfactory piezoelectronic characteristic. In the conventional piezoelectronic device, all piezoceramic nanowires break easily due to low elasticity of the zinc oxide nanotube itself, therefore the piezoelectronic device using the zinc oxide nanowires may have low reliability and short lifespan. Since the carbon nanotubes possess no piezoelectronic characteristic but have good flexibility, and piezoceramic material have satisfactory piezoelectronic characteristic, the present invention combines the two materials and provides a piezoelectronic device having excellent piezoelectronic efficiency and flexibility simultaneously. The induced current obtained from the carbon nanotubes/zinc oxide (core/shell) array piezoelectronic device of the present invention is about 1.5 µA or above, which is $10^6$ times the induced current obtained from the conventional piezoelectronic device. The induced current and voltage can be adjusted depending on the volume (sizes) of the piezoelectronic device, and therefore with the connection in parallel or in series of the piezoelectronic device, the current and voltage can be increased unlimitedly, for example the voltage and the current can be increased to over 1V and 1 mA respectively.

The method of fabricating a piezoelectronic device of the present invention may preferably comprise a step (d1) after the step (d): plasma etching the filling material to expose the plurality of carbon nanotubes.

According to the method of fabricating a piezoelectronic device of the present invention, preferably in the step (c), the piezoceramic layers coating on different carbon nanotubes electrically connect with each other.

According to the method of fabricating a piezoelectronic device of the present invention, in the step (c), the piezoceramic layer that covers the plurality of carbon nanotubes may be preferably formed by an atomic layer deposition method.

The method of fabricating a piezoelectronic device of the present invention may preferably comprise a step (d2) after step (d): forming a first conductive layer on the filling material and the plurality of carbon nanotubes; and a step (f) after step (e): forming a second conductive layer on the piezoelectronic block, to let the first conductive layer and the second conductive layer be arranged respectively at two opposite sides of the piezoelectronic block.

The method of fabricating a piezoelectronic device of the present invention may preferably comprise a step (c0) after the step (c): repeating the step (c) 1 to 2000 times in order to obtain a thickness of 0.5 Å to 2000 Å of the piezoceramic layer that is formed on the carbon nanotubes, which therefore enables a satisfactory piezoelectricity of the piezoelectronic device.

According to the method of fabricating a piezoelectronic device of the present invention, in the step (c), the material of the piezoceramic layer may be zinc oxide (ZnO), aluminium nitride (AlN), gallium nitride (GaN), quartz, tourmaline, Rochelle salts, tantalates, niobates, or barium titanate, and preferably is zinc oxide or aluminum nitride.

The present invention further provides another piezoelectronic device comprising: a substrate; a first conductive layer; a plurality of carbon nanotubes locating between the substrate and the first conductive layer, wherein the plurality of carbon nanotubes is arranged in a comb-shape; and at least one piezoceramic layer located between the substrate and the first conductive layer and covering the plurality of carbon nanotubes, wherein some of the plurality of carbon nanotubes electrically connect with each other through the at least one piezoceramic layer.

The piezoelectronic device of the present invention comprises carbon nanotubes covered with zinc oxide layers and therefore has advantages of being flexible, reliable, and has excellent piezoelectronic efficiency since the carbon nanotubes possess good flexibility and the zinc oxide layers have satisfactory piezoelectronic characteristic. In the conventional piezoelectronic device, all piezoceramic nanowires break easily due to low elasticity thereof, therefore the piezoelectronic device using the zinc oxide nanowires may have low reliability and short lifespan. Since the carbon nanotubes possess no piezoelectronic characteristic but have good flexibility, and piezoceramic materials have a satisfactory piezoelectronic characteristic, the present invention combines the two materials and provides a piezoelectronic device having excellent piezoelectronic efficiency and flexibility simultaneously. The induced current obtained from the carbon nanotubes/zinc oxide (core/shell) array piezoelectronic device of the present invention is about 1.5 µA or above, which is $10^6$ times than the induced current obtained from the conventional piezoelectronic device (e.g. the induced current obtained from the conventional piezoelectronic device is about $10^{-12}$ to $10^{-9}$ A). The induced current and voltage can be adjusted depending on the volume (sizes) of the piezoelectronic device, and therefore with the connection in parallel or in series of the piezoelectronic device, the current and voltage can be increased unlimitedly, for example the voltage and the current can be increased to over 1V and 1 mA respectively.

According to the piezoelectronic device of the present invention, preferably, the piezoceramic layers coating on different carbon nanotubes electrically connect with each other.

According to the piezoelectronic device of the present invention, when no mechanical stress is applied on the first conductive layer, some (or none) carbon nanotubes may contact with the first conductive layer. But when a mechanical stress is applied on the first conductive layer, some or all ends of the carbon nanotubes may contact with the first conductive layer. Under the circumstances with no applied mechanical stress, it is possible that some ends or no end of the carbon nanotubes is in contact with the first conductive layer. Then, after the contact between the carbon nanotubes and the first conductive layer, with a continuous mechanical stress applied to the first conductive layer, the carbon nanotubes are compressed (deformed) and a voltage difference (potential difference) or current difference is induced between the first conductive layer and the second conductive layer, which is the so-called piezoelectronic effect.

The piezoelectronic device of the present invention may preferably further comprise a second conductive layer formed on the substrate and located between the substrate and the plurality of carbon nanotubes, and the plurality of carbon nanotubes locate on the second conductive layer. The second conductive layers may be used to assist the current collection.

The piezoelectronic device of the present invention may preferably further comprise a filling material deposited in a space between the carbon nanotubes that is covered with the at least one piezoceramic layer. The filling material may be used to support the carbon nanotubes to prevent the carbon nanotubes from being broken and improve the lifespan of the piezoelectronic device. The filling material may be preferably selected from a group consisted of: parylene, polyurethane, polyethylene, polyvinylchloride, polydimethylsiloxane, pyromellitic dianhydride, polyimide, polyvinyl alcohol, and a mixture thereof. The filling material may be used to connect the carbon nanotubes and enable the carbon nanotubes to be stuck together to provide a flexible piezoelectronic film with good reliability (long lifetime).

According to the piezoelectronic device of the present invention, the first conductive layer and the second conductive layer are used as the electrodes and may be independently made of metal such as gold, silver, copper, platinum, titanium, palladium, or the alloy thereof, but each is not limited thereto.

According to the piezoelectronic device of the present invention, the piezoceramic layer that covers the plurality of carbon nanotubes may be preferably formed by an atomic layer deposition method. With the using of the atomic layer deposition method, a surface with a high aspect ratio can then be deposited with the piezoceramic material. However, if another method (e.g. dip-coating method, sol-gel method, or wet chemical method) instead of the atomic layer deposition method is used, a surface with a high aspect ratio may not be uniformly deposited, and the uniformity of the piezoceramic layer covering on the carbon nanotubes is lowered as well as the piezoelectronic characteristic of the piezoelectronic device.

According to the piezoelectronic device of the present invention, the piezoceramic layer covering on the carbon nanotubes may preferably have a thickness of 0.5 Å to 2000 Å. The thickness of the piezoceramic layer correlates closely with the piezoelectronic efficiency of the piezoelectronic device and therefore should be properly controlled.

According to the piezoelectronic device of the present invention, the material of the piezoceramic layer is not specially limited, as long as it is a material that has piezoelectronic characteristic, for example, the material of the piezoceramic layer may be $BaTiO_3$ (BT, barium titanate), $Pb(Zr_{0.53}Ti_{0.47})O_3$ (PZT, lead zirconate-titanate), quartz, tourmaline, Rochelle salts, tantalates, niobates, zinc oxide (ZnO), aluminium nitride (AlN), or gallium nitride (GaN), and preferably is zinc oxide or aluminum nitride (AlN).

Also, the present invention provides another method of fabricating a piezoelectronic device, which comprises steps: (a) providing a substrate; (b) forming a plurality of carbon nanotubes on the substrate; (c) forming at least one piezoceramic layer covering the plurality of carbon nanotubes, wherein some of the carbon nanotubes electrically connect with each other through the at least one piezoceramic layer; and (d) forming a first conductive layer on the plurality of carbon nanotubes that is covered with the least one piezoceramic layer.

The piezoelectronic device made by the method of the present invention comprises carbon nanotubes covered with zinc oxide layers and therefore has advantages of being flexible and reliable, further having excellent piezoelectronic efficiency since the carbon nanotubes possess good flexibility and the zinc oxide layers have satisfactory piezoelectronic characteristic. In the conventional piezoelectronic device, all piezoceramic nanowires break easily due to low elasticity, therefore the piezoelectronic device using the zinc oxide nanowires may have low reliability and short lifespan. Since the carbon nanotubes possess no piezoelectronic characteristic but have good flexibility, and piezoceramic have satisfactory piezoelectronic characteristic, the present invention combines the two materials and provides a piezoelectronic device having excellent piezoelectronic efficiency and flexibility simultaneously. The induced current obtained from the carbon nanotubes/zinc oxide (core/shell) array piezoelectronic device of the present invention is about 1.5 μA or above, which is $10^6$ of the induced current obtained from the conventional piezoelectronic device. The induced current and voltage can be adjusted depending on the volume (sizes) of the piezoelectronic device, and therefore with the connection in parallel or in series of the piezoelectronic device, the current and voltage can be increased unlimitedly, for example the voltage and the current can be increased to over 1V and 1 mA respectively.

According to the method of fabricating a piezoelectronic device of the present invention, preferably in the step (c), the piezoceramic layers coating on different carbon nanotubes electrically connect with each other.

The method of fabricating a piezoelectronic device of the present invention may preferably comprise a step (a1) between the steps (a) and (b): forming a second conductive layer on the substrate, to let the plurality of carbon nanotubes locate between the first conductive layer and the second conductive layer, wherein the ends the carbon nanotubes connect with the second conductive layer.

The method of fabricating a piezoelectronic device of the present invention may preferably comprise a step (c1) between the steps (c) and (d): filling a space between the carbon nanotubes, which is covered with the at least one piezoceramic layer, with a filling material. The filling material may be used to connect the carbon nanotubes and enable the carbon nanotubes to be stuck together to provide a flexible piezoelectronic film with good reliability (long lifetime). The filling material may be a polymer, and preferably is selected from a group consisted of: parylene, polyurethane, polyethylene, polyvinylchloride, polydimethylsiloxane, pyromellitic dianhydride, polyimide, polyvinyl alcohol, and a mixture thereof, but is not limited thereto. In the step (c1), the filling material may be deposited using a thermal evaporation method or vacuum infiltration method. Meanwhile, a step (c2) may be further included after the step (c1): plasma etching the filling material to expose the plurality of carbon nanotubes.

According to the method of fabricating a piezoelectronic device of the present invention, in the step (c), the piezoceramic layer that covers the plurality of carbon nanotubes may be preferably formed by an atomic layer deposition method. With the using of the atomic layer deposition method, a surface with a high aspect ratio can then be deposited with the piezoceramic material. However, if another method (for example, a dip-coating method, a sol-gel method, or a wet chemical method) instead of the atomic layer deposition method is used, a surface with a high aspect ratio may not be uniformly deposited, and the uniformity of the piezoceramic layer covering on the carbon nanotubes is lowered as well as the piezoelectronic characteristic of the piezoelectronic device.

According to the method of fabricating a piezoelectronic device of the present invention, in the step (c), the thickness of the single piezoceramic layer covering on the carbon nanotubes may preferably be 0.3 Å to 1.5 Å, wherein the single piezoceramic layer is formed by single cycling with the atomic layer deposition.

The method of fabricating a piezoelectronic device of the present invention may preferably comprise a step (c0) after the step (c): repeating the step (c) 1 to 2000 times in order to obtain a thickness of 0.5 Å to 2000 Å of the piezoceramic layer that is formed on the carbon nanotubes, and therefore to enable a satisfactory piezoelectricity of the piezoelectronic device.

According to the method of fabricating a piezoelectronic device of the present invention, in the step (a), the substrate may be a silicon-based substrate or a glass substrate, but is not limited thereto.

According to the method of fabricating a piezoelectronic device of the present invention, the first conductive layer and the second conductive layer are used as the electrodes and may be independently made of metal such as gold, silver, copper, platinum, titanium, palladium, or the alloy thereof, but each is not limited thereto.

According to the method of fabricating a piezoelectronic device of the present invention, the material of the piezoceramic layer is not specially limited, as long as it is a material that has piezoelectronic characteristic, for example, the material of the piezoceramic layer may be $BaTiO_3$ (BT, barium titanate), $Pb(Zr_{0.53}Ti_{0.47})O_3$ (PZT, lead zirconate-titanate), quartz, tourmaline, Rochelle salts, tantalates, niobates, zinc oxide (ZnO), aluminium nitride (AlN), or gallium nitride (GaN), and preferably is zinc oxide or aluminum nitride (AlN).

Other objects, advantages, and novel features of the invention will become more apparent from the following detailed description when taken in conjunction with the accompanying drawings.

DETAILED DESCRIPTION OF THE PREFERRED EMBODIMENT

Example 1

Figure 1:
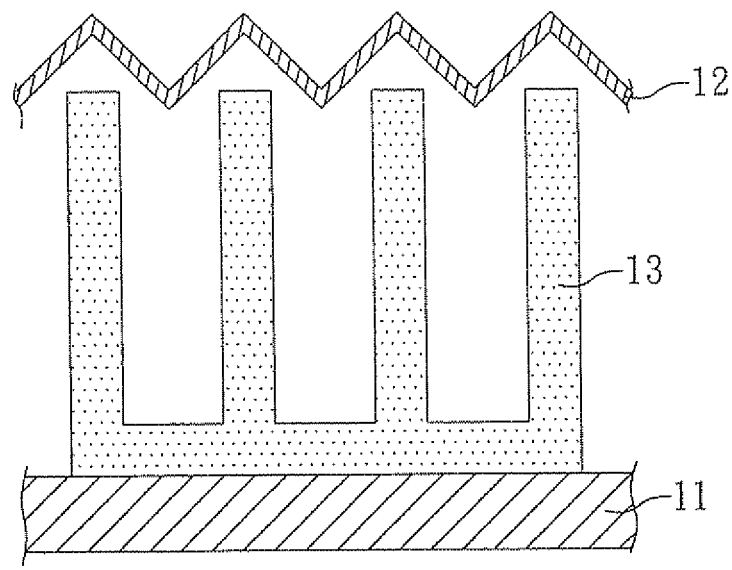
FIG. 1 is a schematic view of a conventional piezoelectronic device.
Figure 2A:
FIGS. 2A-2H show a schematic process flow chart of fabricating a piezoelectronic device of the example 1.
Figure 2B:
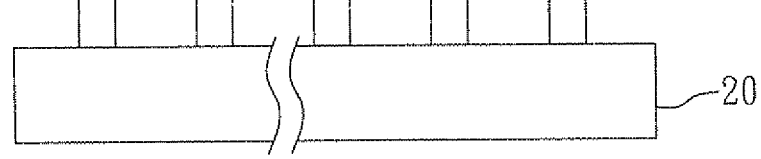

With reference to FIGS. 2A-2H, a process flow chart of fabricating a piezoelectronic device of the present example is shown. First, (a) a substrate 20 is provided, as shown in FIG. 2A. Then, (b) a plurality of carbon nanotubes 23 is formed on the substrate 20, as shown in FIG. 2B. Herein, the substrate 20 is a silicon-based substrate.

Figure 2C:
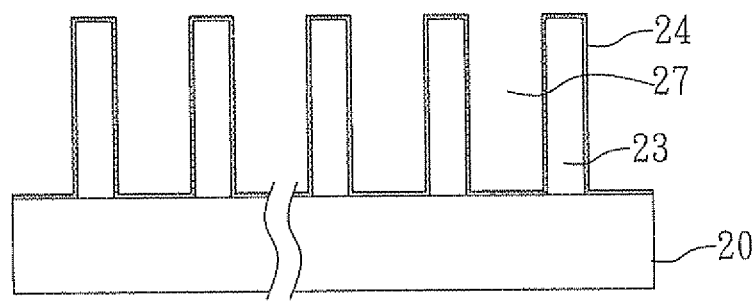

Then, (c) a zinc oxide layer 24 (i.e. the piezoceramic layer) is formed and covers the plurality of carbon nanotubes 23 by an atomic layer deposition method, as shown in FIG. 2C, and (c0) the atomic layer deposition in the step (c) is repeated for 800 cycles (not shown) to obtain a total thickness of about 640 Å of the zinc oxide layer.

Figure 2D:
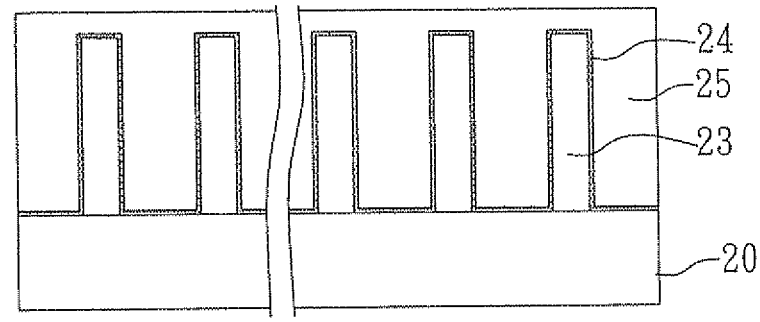
Figure 2E:
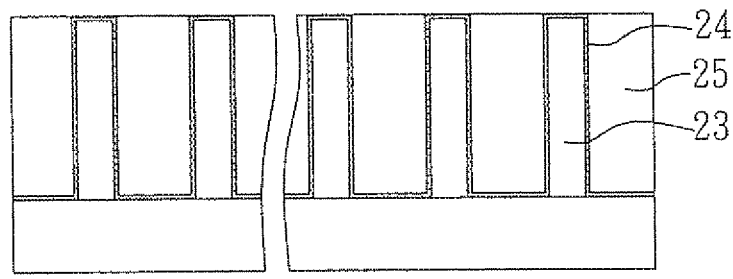

Then, (d) a space 27 between the carbon nanotubes 23, which is covered with the at least one piezoceramic layer 24, is filled with a filling material 25 by a thermo evaporation method, as shown in FIGS. 2C and 2D. Herein, parylene is used as the filling material 25. Then, (d1) the filling material 25 is plasma etched to expose the plurality of carbon nanotubes 23, as shown in FIG. 2E.

Figure 2F:
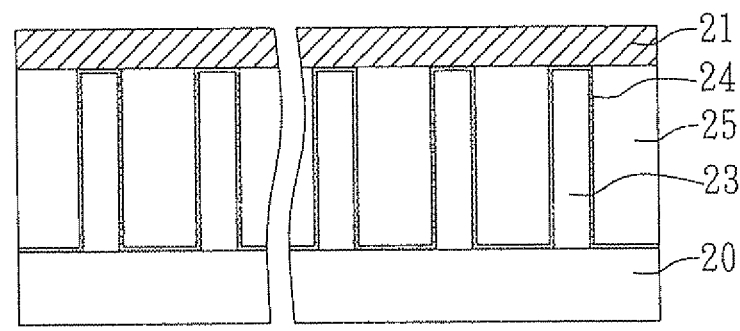

Then, (d2) a first conductive layer 21 is formed on the filling material 25 and on the carbon nanotubes 23 that are covered with the piezoceramic layer 24, in which the first conductive layer 21 electrically connects with the piezoceramic layer 24 covering on the carbon nanotubes 23, as shown in FIG. 2F. Herein, the first conductive layer 21 is made of gold.

Figure 2G:
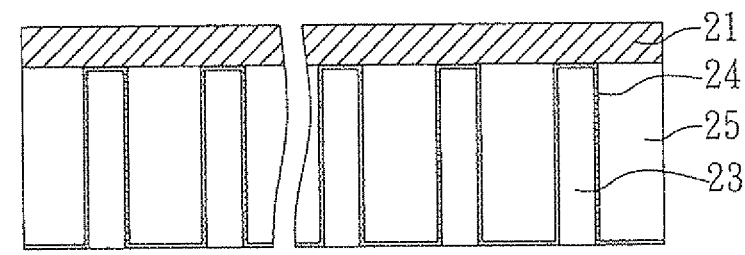

Then, (e) the substrate 20 is removed as shown in FIG. 2G, and (f) a second conductive layer 22 is formed on the carbon nanotubes 23 so that the carbon nanotubes 23 covered with the piezoceramic layer 24 locate between the first conductive layer 21 and the second conductive layer 22. Therefore, the piezoelectronic device 2 of the present example is obtained. Herein, the second conductive layer 22 is made of gold.

Herein, the piezoceramic layer is made of zinc oxide, but the material of the piezoceramic layer of the present invention is not specially limited thereto, the material of the piezoceramic layer may also be, for a example, aluminium nitride (AlN), gallium nitride (GaN), $BaTiO_3$ (BT, barium titanate), $Pb(Zr_{0.53}Ti_{0.47})O_3$ (PZT, lead zirconate-titanate), quartz, tourmaline, Rochelle salts, tantalates, niobates, etc. having piezoceramic characteristic.

Figure 2H:
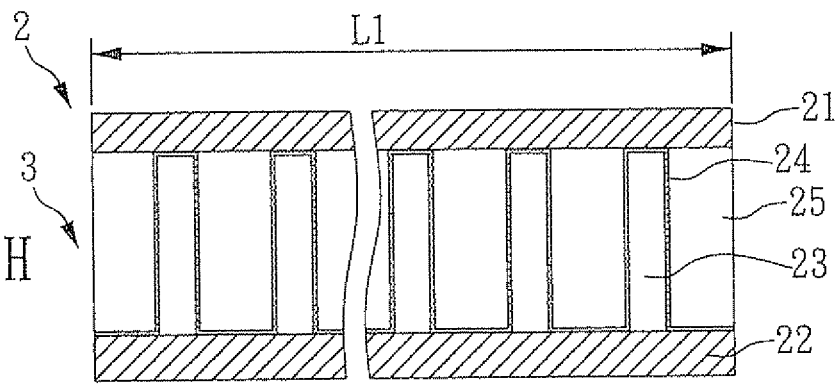

As shown in FIG. 2H, the piezoelectronic device 2 of the present example comprises: a plurality of carbon nanotubes 23, a piezoceramic layer 24, a supporting material 25, a first conductive layer 21 and a second conductive layer 22. The piezoceramic layer 24 covers the plurality of carbon nanotubes 23. The supporting material 25 is disposed between the carbon nanotubes 23 covered with the piezoceramic layer 24 in order to support the carbon nanotubes 23 and prevent the carbon nanotubes 23 from being broken and improve the lifespan of the piezoelectronic device 2. The carbon nanotubes 23 are arranged in a comb-shape. The piezoceramic layer 24 coated on different carbon nanotubes 23 electrically connects with each other, and some of the carbon nanotubes 23 electrically connect with each other through the at least one piezoceramic layer 24. The carbon nanotubes 23, the piezoceramic layer 24, and the supporting material 25 together form a piezoelectronic block 3. The first conductive layer 21 and the second conductive layer 22 are arranged at two opposite sides of the piezoelectronic block respectively, and the first conductive layer 21 and the second conductive layer 22 are electrically connected with the piezoceramic layer 24 of the piezoelectronic block 3.

The piezoelectronic device (with a structure of carbon nanotube/zinc oxide) made by the method of the present invention comprises carbon nanotubes covered with zinc oxide layers and therefore has advantages of being flexible and reliable, further having excellent piezoelectronic efficiency simultaneously since the carbon nanotubes possess good flexibility and the zinc oxide layers have satisfactory piezoelectronic characteristic. Meanwhile, the using of the atomic layer deposition method increases the uniformity of the zinc oxide layer that covers on the carbon nanotubes.

As shown in FIG. 2H, according to the piezoelectronic device 2 of the present example, the first conductive layer 21, the second conductive layer 22, and the piezoelectronic block 3 are connected in parallel (i.e. the axial direction of the carbon nanotubes 23 is practically perpendicular to the surface of the first and the second conductive layers 21,22), and the current can be increased to over 1 μA when the parallel connecting length L1 of the piezoelectronic device 2 is more than 1 mm.

Figure 3:
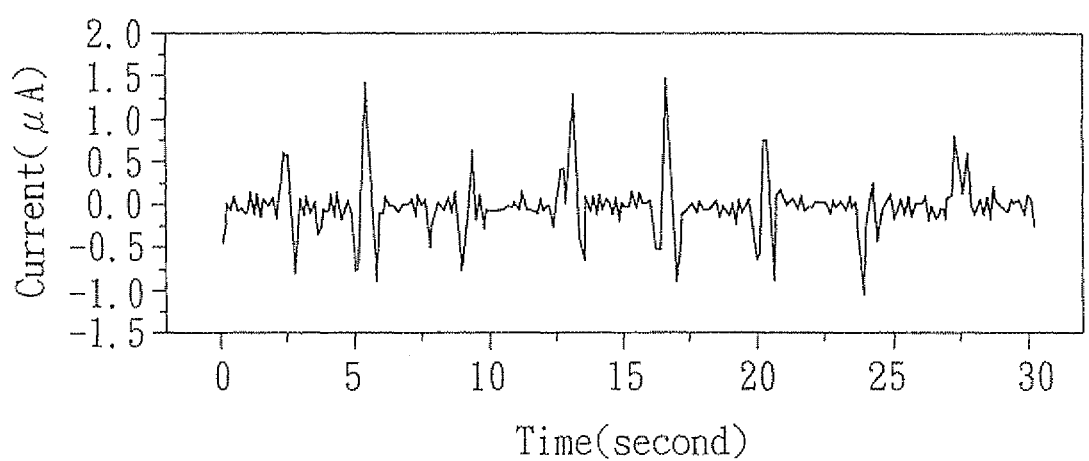
FIG. 3 is the testing result of the induced current of the piezoelectronic device of the example 1.

From the electrical current experimental result, it is proved that the induced current of a single piezoelectronic device of the present invention can achieve 1.5 μA or above (as shown in FIG. 3), which is $10^6$ of the induced current obtained from the conventional piezoelectronic device. In the present invention, the induced current and voltage can be adjusted depending on the volume (sizes) of the piezoelectronic device, and therefore with the connection in parallel or in series of the piezoelectronic device, the current and voltage can be increased unlimitedly, for example the voltage and the current can be increased to over 1V and 1 mA respectively. The filling material may be used to connect the carbon nanotubes and enable the carbon nanotubes to be stuck together to provide a flexible piezoelectronic film with good reliability (long lifetime). Therefore, the piezoelectronic device of the present invention has advantages of being excellent in piezoelectronic efficiency, and good reliability (long lifetime) that cannot be realized by a conventional piezoelectronic device.

Example 2

Figure 4A:
FIGS. 4A-4F show a schematic process flow chart of fabricating a piezoelectronic device of the example 2.
Figure 4B:

With reference to FIGS. 4A-4F, a process flow chart of fabricating a piezoelectronic device of the present example is shown. First, (a) a substrate 20 is provided, as shown in FIG. 4A. Then, (b) a plurality of carbon nanotubes 23 is formed on the substrate 20, as shown in FIG. 4B. Herein, the substrate 20 is a silicon-based substrate.

Figure 4C:
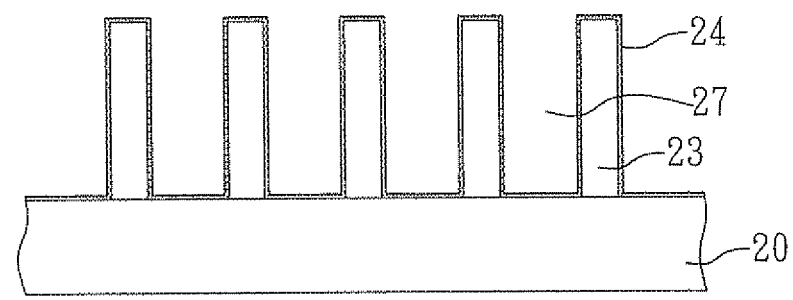

Then, (c) a zinc oxide layer 24 is formed and covers the plurality of carbon nanotubes 23 by an atomic layer deposition method, as shown in FIG. 4C, and (c0) the atomic layer deposition in the step (c) is repeated for 800 cycles (not shown) to obtain a total thickness of about 640 Å of the zinc oxide layer.

Figure 4D:
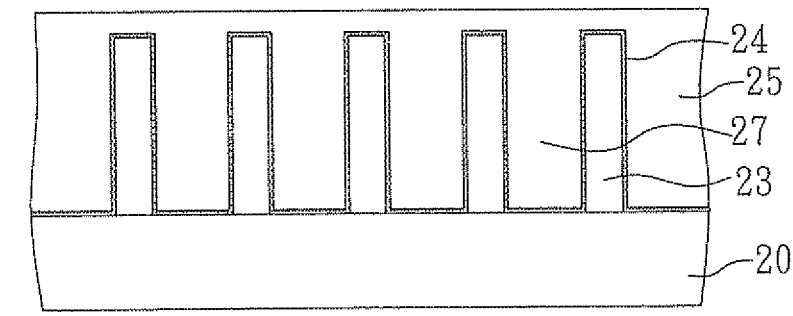
Figure 4E:
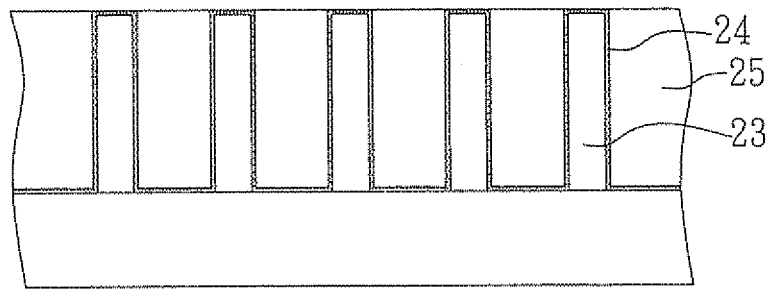

Then, (d) a space 27 between the carbon nanotubes 23, which is covered with the at least one piezoceramic layer 24, is filled with a filling material 25 by a vacuum infiltration method, as shown in FIG. 4D. Herein, parylene is used as the filling material 25. Next, (d1) the filling material 25 is plasma etched to expose the plurality of carbon nanotubes 23, as shown in FIG. 4E.

Finally, (e) the substrate 20 is removed as shown in FIG. 2F, and the piezoelectronic device 2 of the present example is obtained, in which the carbon nanotubes 23, the piezoceramic layer 24, and the supporting material 25 together form a piezoelectronic block 3.

Figure 4F:
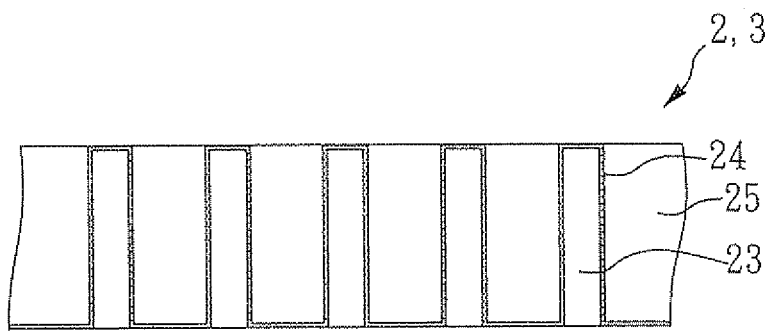

As shown in FIG. 4F, the piezoelectronic device 2 of the present example comprises: a plurality of carbon nanotubes 23, a piezoceramic layer 24, and a supporting material 25. The piezoceramic layer 24 covers the plurality of carbon nanotubes 23, and the supporting material 25 is disposed between the carbon nanotubes 23 in order to support the carbon nanotubes 23. The carbon nanotubes 23 are arranged in a comb-shape, the piezoceramic layer 24 coated on different carbon nanotubes 23 electrically connects with each other, and some of the carbon nanotubes 23 electrically connect with each other through the at least one piezoceramic layer 24. The carbon nanotubes 23, the piezoceramic layer 24, and the supporting material 25 together form a piezoelectronic block 3.

Example 3

A piezoelectronic block 3 is provided using the same method as described in the example 2 (steps (a) to (e)), as shown in FIGS. 4A to 4F. Then, as shown in FIG. 5, (f1) a first and a second conductive layer 21 and 22 are respectively formed on the two side surfaces 33 and 34 of the piezoelectronic block 3 and electrically connect with the piezoceramic layer 24.

Figure 5:
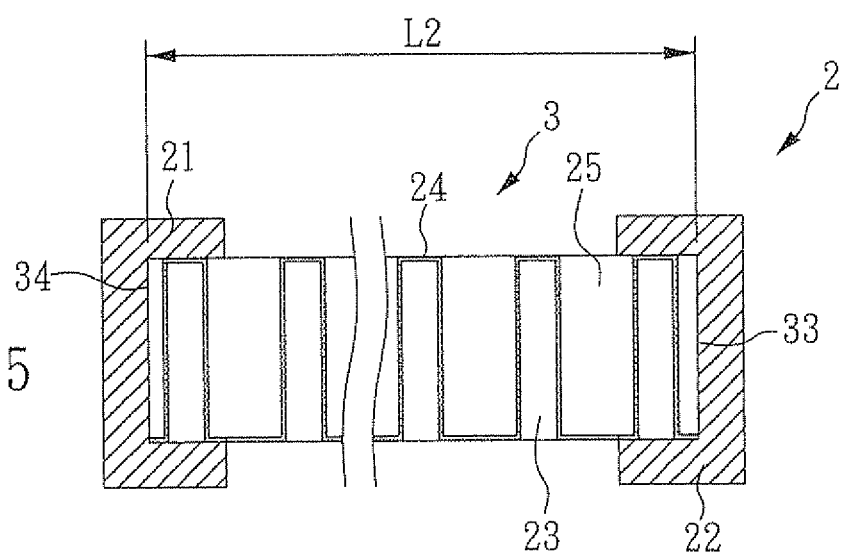
FIG. 5 is a schematic view of a piezoelectronic device of the example 3.

Reference with FIG. 5, according to the piezoelectronic device 2 of the present example, the first conductive layer 21, the second conductive layer 22, and the piezoelectronic block 3 are connected in series (i.e. the axial direction of the carbon nanotubes 23 is practically parallel to the surface of the first and the second conductive layers 21,22), and the voltage can be increased to over 1V when the series connecting length L2 of the piezoelectronic device 2 is more than 2.5 mm.

Example 4

Figure 6A:
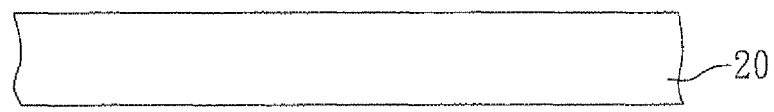
FIGS. 6A-6D show a schematic process flow chart of fabricating a piezoelectronic device of the example 4.
Figure 6B:
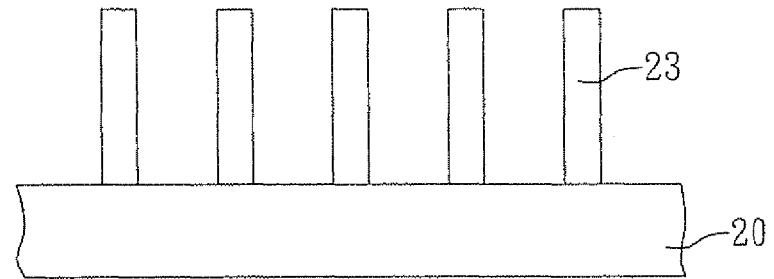

With reference to FIGS. 6A-6D, a process flow chart of fabricating a piezoelectronic device of the present example is shown. First, (a) a substrate 20 is provided, as shown in FIG. 6A. Then, (b) a plurality of carbon nanotubes 23 is formed on the substrate 20, as shown in FIG. 6B. Herein, the substrate 20 is a silicon-based substrate.

Figure 6C:
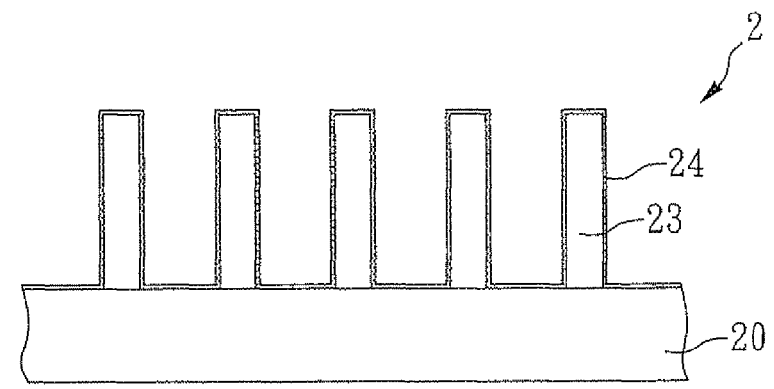

Then, (c) a zinc oxide layer 24 is formed and covers the plurality of carbon nanotubes 23 by an atomic layer deposition method, as shown in FIG. 6C, in which the zinc oxide layers 24 coated on different carbon nanotubes 23 electrically connect with each other. Then, (c0) the atomic layer deposition in the step (c) is repeated for 800 cycles (not shown) to obtain a total thickness of about 640 Å of the zinc oxide layer.

Figure 6D:
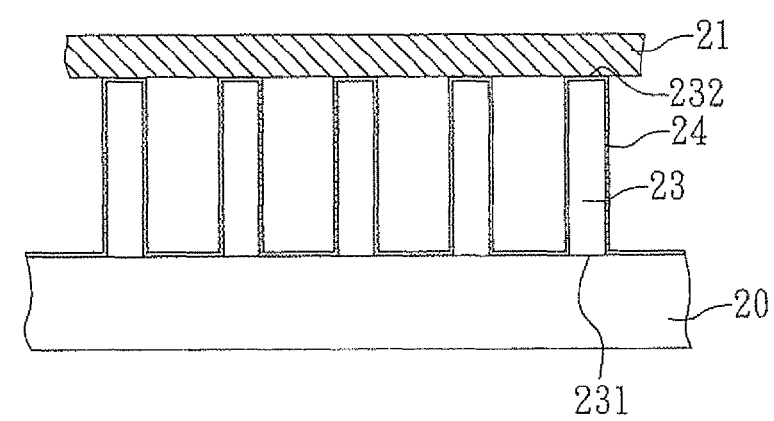

Then, as shown in FIG. 6D, (d) a first conductive layer 21 is formed on the carbon nanotubes 23 covered with the zinc oxide layer 24.

With reference to FIG. 6D, the piezoelectronic device 2 of the present example comprises: a substrate 20, a first conductive layer 21, a plurality of carbon nanotubes 23, and a zinc oxide layer 24. The carbon nanotubes 23 locate between the substrate 20 and the first conductive layer 21, and the carbon nanotubes are arranged in a comb-shape. The zinc oxide layer 24 locates between the substrate 20 and the first conductive layer 21 and covers the plurality of carbon nanotubes 23. Meanwhile, the ends 231 of the carbon nanotubes 23 connect with substrate 20.

Example 5

Figure 7A:
FIGS. 7A-7D show a schematic process flow chart of fabricating a piezoelectronic device of the example 5.
Figure 7B:
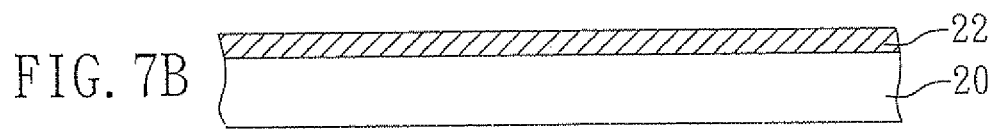
Figure 7C:
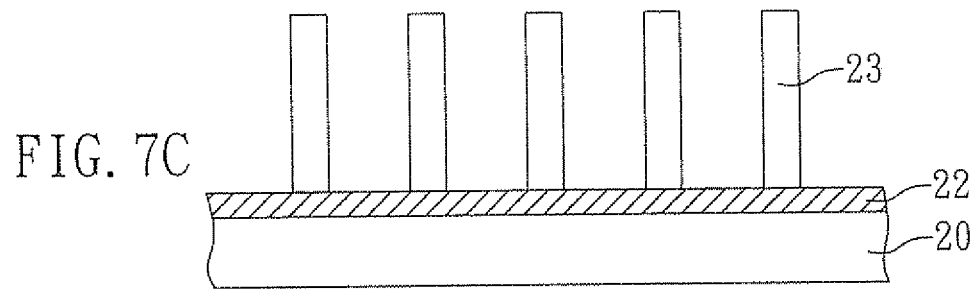

With reference to FIGS. 7A-7D, a process flow chart of fabricating a piezoelectronic device of the present example is shown. First, (a) a substrate 20 is provided, as shown in FIG. 7A. Then, (b) a second conductive layer 22 is formed on the substrate 20, as shown in FIG. 7B. After that, (c) a plurality of carbon nanotubes 23 is formed on the second conductive layer 22, as shown in FIG. 7C. Subsequently, (d) a zinc oxide layer 24 is formed and covers the plurality of carbon nanotubes 23 by an atomic layer deposition method and followed with (d0) repeating the atomic layer deposition of the step (d) for 100 cycles (not shown) to obtain a total thickness of about 800 Å of the zinc oxide layer. The substrate 20 used herein is a silicon-based substrate, and the material of the second conductive layer 22 is titanium-gold alloy.

Figure 7D:
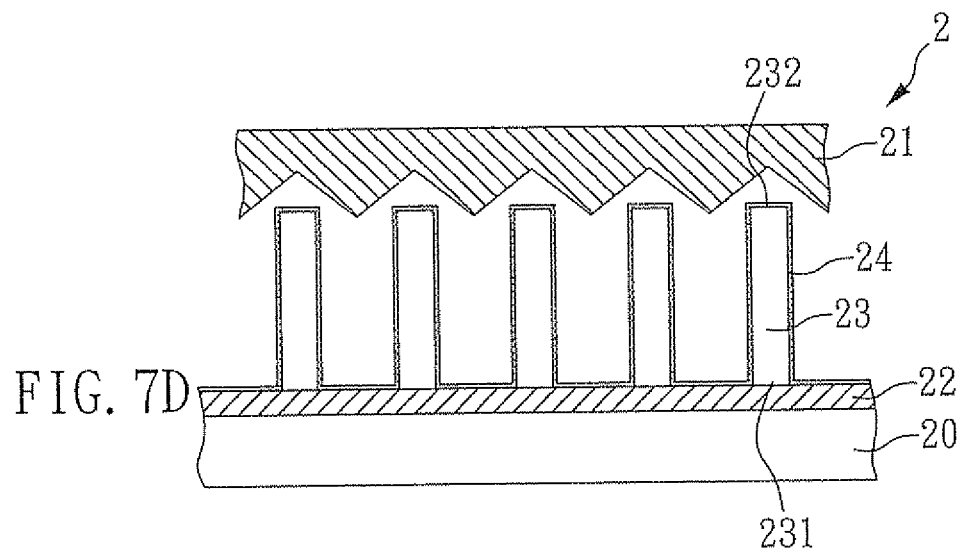

Finally, as shown in FIG. 7D, a first conductive layer 21 having a rugged surface is provided on the carbon nanotubes 23 coated with a zinc oxide layer 24. Herein, the material of the first conductive layer 21 is titanium-gold alloy.

With reference to FIG. 7D, the piezoelectronic device 2 of the present example comprises: a substrate 20, a first conductive layer 21, a second conductive layer 22, a plurality of carbon nanotubes 23, and a piezoceramic layer 24. The second conductive layer 22 locates on the substrate 20, the carbon nanotubes 23 locate on the second conductive layer 22, and the carbon nanotubes 23 are arranged in a comb-shape. The piezoceramic layer 24 locates between the substrate 20 and the first conductive layer 21 and covers the plurality of carbon nanotubes 23. The carbon nanotubes 23 electrically connect with each other through the piezoceramic layer 24. Some of the carbon nanotubes 23 electrically connect with each other through the at least one piezoceramic layer 24. Meanwhile, the ends 231 of the carbon nanotubes 23 connect with the second conductive layer 22.

Figure 7E:
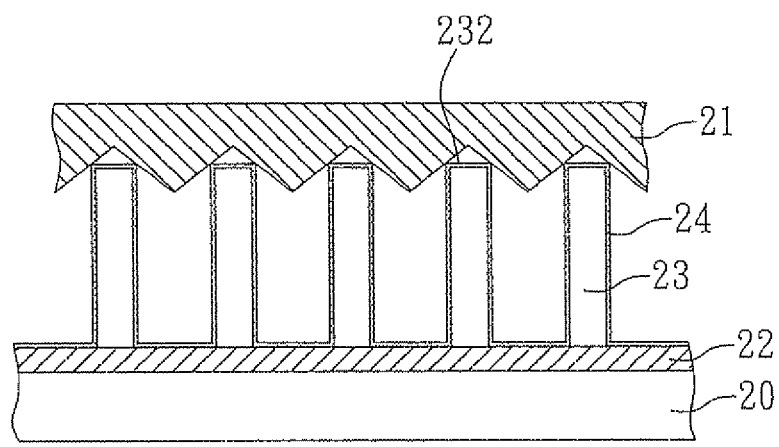
FIGS. 7E-7F are schematic views when a mechanical stress is applied on the first conductive layer of the piezoelectronic device of the example 5.
Figure 7F:
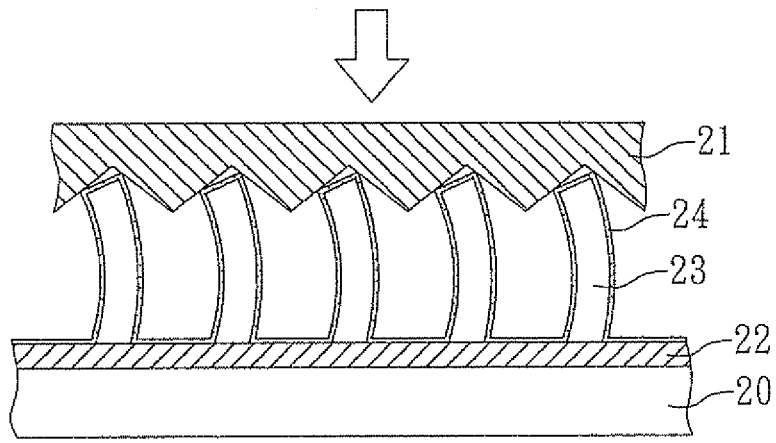

According to the present example, when no mechanical stress is applied on the first conductive layer 21, some (or no) ends 232 opposite to the end 231 of the carbon nanotubes 23 may contact with the first conductive layer 21, as shown in FIG. 7D. But when a mechanical stress is applied on the first conductive layer 21, some or all ends 232 of the carbon nanotubes 23 will contact with the first conductive layer 21, as shown in FIG. 7E. Then, after the contact of the carbon nanotubes 23 and the first conductive layer 21, with a continuous mechanical stress applied to the first conductive layer 21, the carbon nanotubes 23 are compressed (deformed) and a voltage difference (potential difference) or current difference is induced between the first conductive layer 21 and the second conductive layer 22, which is the so-called piezoelectronic effect.

Accordingly, the present invention provides a piezoelectronic device which has excellent piezoelectronic efficiency and flexibility. The piezoelectronic device of the present invention comprises carbon nanotubes covered with zinc oxide layers and therefore has advantages of being flexible and reliable, further having excellent piezoelectronic efficiency since the carbon nanotubes possess good flexibility and the zinc oxide layers have satisfactory piezoelectronic characteristic. The induced current obtained from the piezoelectronic device of the present invention is about 1.5 µA or above (which is $10^3$-$10^6$ times the current of prior arts) as well as induced voltage being over 1V (which is 10 to 100 times the voltage of prior arts) when the size of the piezoelectronic block is 2.5 mm×1 mm×1 mm (length×width×height) compared with an induced current of $10^{-12}$ to $10^{-9}$ A of a conventional piezoelectronic device. The induced voltage and current of the piezoelectronic device of the present invention can be regulated depending on the volume of the piezoelectronic device, i.e. the voltage can be increased to 1V or above and the current to 1 mA or above by connecting several piezoelectronic devices in parallel or in series, or by increasing the size of single piezoelectronic device.

The piezoelectronic device of the present invention can be applied into numerous uses such as bio-medical usages, electrical vehicle, wind power plants, hydroelectric power plant, wireless sensors, personal electronics, micro-electro-mechanical systems (MEMS) or nano-electro-mechanical systems (NEMS) etc. Compared with the conventional piezoelectronic device, the piezoelectronic device of the present invention has excellent reliability and piezoelectronic characteristics that cannot be achieved by the prior arts.

Although the present invention has been explained in relation to its preferred embodiment, it is to be understood that many other possible modifications and variations can be made without departing from the scope of the invention as hereinafter claimed.

What is claimed is:

1. A method of fabricating a piezoelectronic device, which comprises steps:
   (a) providing a substrate;
   (b) forming a plurality of carbon nanotubes on the substrate;
   (c) forming at least one piezoceramic layer covering the plurality of carbon nanotubes, wherein some of the carbon nanotubes electrically connect with each other through the at least one piezoceramic layer;
   (d) filling a space between the carbon nanotubes, which is covered with the at least one piezoceramic layer, with a filling material; and
   (e) removing the substrate to provide a piezoelectronic block comprising the carbon nanotubes, the at least one piezoceramic layer, and the filling material.

2. The method of fabricating a piezoelectronic device as claimed in claim 1, further comprising: plasma etching the filling material to expose the plurality of carbon nanotubes.

3. The method of fabricating a piezoelectronic device as claimed in claim 1, further comprising: forming a first conductive layer on the filling material and the plurality of carbon nanotubes; and forming a second conductive layer on the piezoelectronic block, to let the first conductive layer and the second conductive layer to be arranged respectively at two opposite sides of the piezoelectronic block.

4. The method of fabricating a piezoelectronic device as claimed in claim 1, wherein, the piezoceramic layer that covers the plurality of carbon nanotubes is formed by an atomic layer deposition method.

5. The method of fabricating a piezoelectronic device as claimed in claim 1, further comprising: repeating the step 1 to 2000 times.

6. The method of fabricating a piezoelectronic device as claimed in claim 5, wherein the piezoceramic layer, which covers the carbon nanotubes, has a total thickness of 0.5 Å to 2000 Å.

7. The method of fabricating a piezoelectronic device as claimed in claim 1, wherein the piezoceramic layer is made from a group a group consisting of zinc oxide, aluminum nitride, gallium nitrade, rochelle salt, tantalite, niobates, or barium titanate.

* * * * *